(12) United States Patent
Kim et al.

(10) Patent No.: US 7,388,371 B2
(45) Date of Patent: Jun. 17, 2008

(54) METHOD FOR CONTROLLING CHARACTERISTICS OF DOUBLE RELAXATION OSCILLATION SQUID WITH REFERENCE JUNCTION

(75) Inventors: Jin-Mok Kim, Daejeon (KR); Yong-Ho Lee, Daejeon (KR); Yong-Ki Park, Daejeon (KR); Hyukchan Kwon, Daejeon (KR); Kiwoong Kim, Daejeon (KR)

(73) Assignee: Korea Research Institute of Standards and Science (KR)

( * ) Notice: Subject to any disclaimer, the term of this patent is extended or adjusted under 35 U.S.C. 154(b) by 0 days.

(21) Appl. No.: 11/414,712

(22) Filed: Apr. 28, 2006

(65) Prior Publication Data

US 2007/0241746 A1    Oct. 18, 2007

(30) Foreign Application Priority Data

Apr. 14, 2006    (KR) ...................... 10-2006-0033860

(51) Int. Cl.
G01R 33/02    (2006.01)

(52) U.S. Cl. ...................................... 324/248; 505/846
(58) Field of Classification Search ................ 324/248, 324/260; 505/845–874; 257/31; 327/527
See application file for complete search history.

(56) References Cited

U.S. PATENT DOCUMENTS 5,406,201 A * 4/1995 Kiryu et al. ................. 324/248

FOREIGN PATENT DOCUMENTS

KR    2002078325    * 10/2002

OTHER PUBLICATIONS

Kim et al., Effect of Additional Reference Current in a Reference Junction-Double Relaxation Oscillation SQUID (RJ-DROS). Mar. 2007, IEEE Transactions On Applied Superconductivity, vol. 17, No. 1.*

"Multichannel applications of double relaxation oscillation SQUIDS"; Authors: Yong-Ho Lee, et al.; Institute of Physics Publishing, Supercond. Sci. Technol. 14, pp. 1022-1026 (2001).

"Two-Stage Integrated Squid Amplifier With Series Array Output"; Authosr: Richard P. Welty, et al.; IEEE Transactiond on Applied Superconductivity, vol. 3, No. 1, pp. 2605-2608 (1993).

(Continued)

Primary Examiner—Jay M Patidar
(74) Attorney, Agent, or Firm—Cantor Colburn LLP

(57) ABSTRACT

The present invention relates to a method of controlling the characteristics of a double relaxation oscillation SQUID having a reference junction. In the method of controlling characteristics of a reference junction-type double relaxation oscillation SQUID (RJ-DROS) having a signal SQUID and a reference junction, a reference DC current flows through the reference junction in order to control the characteristics of the DROS. A modulation width of an averaged relaxation voltage, which reacts to a magnetic flux, may be controlled at the reference junction. An amount (modulation depth) of an averaged relaxation voltage, which reacts to a magnetic flux, may be controlled at the reference junction. An amount of an operation application current may be controlled at the reference junction. Accordingly, the reference current of the reference junction can be changed by causing the current to flow through the reference junction. A magnetic flux-voltage characteristic and a transfer coefficient of the DROS can be easily controlled externally and the DROS can operate stably.

6 Claims, 5 Drawing Sheets

OTHER PUBLICATIONS

"Digital Feedback loops for d.c. SQUIDS"; Auhtor: D. Drung; Cryogenics, vol. 26, pp. 623-627, (1986).

"Advanced Squid Read-Out Electronics"; Author: Dietmar Drung; Supplied by The British Library—"The worlds's knowledge", pp. 63-116 (1996).

"(Double) relaxation oscillation SQUIDS with high flux-to-voltage transfer: Simulations and experiments"; Authors: D.J. Adelerhof, et al.; J.Appl. Phys.76; pp. 3875-3886 (1994).

* cited by examiner

METHOD FOR CONTROLLING CHARACTERISTICS OF DOUBLE RELAXATION OSCILLATION SQUID WITH REFERENCE JUNCTION

BACKGROUND OF THE INVENTION

1. Field of the Invention

The present invention relates to a superconducting quantum interference device (SQUID), and more particularly, to a method of controlling the characteristics of a double relaxation oscillation SQUID having a reference junction.

2. Background of the Related Art

In general, a SQUID refers to a high-sensitivity magnetometer capable of detecting up to a minute magnetic flux density employing Josephson effect. More particularly, a double relaxation oscillation SQUID (hereinafter, referred to as a "DROS") has a great magnetic flux-voltage characteristic and a high transfer coefficient and can detect a fast magnetic flux signal using a simple pre-amplifier.

FIG. 1 is an equivalent circuit diagram of a DROS having a reference SQUID (RS-DROS) in the related art. FIG. 2 is an equivalent circuit diagram of a DROS having a reference junction (RJ-DROS) in the related art.

As shown in FIG. 1, in the reference SQUID type DROS (RS-DROS) 11 having a signal SQUID 12 and a reference SQUID 13, current flows from a reference voltage application current source current controller 18 to a reference SQUID coil 16 and changes the magnetic flux of the reference SQUID coil 16. Accordingly, a critical current of the reference SQUID 13 is controlled to control a magnetic flux-voltage characteristic so that the DROS operates under an optimal condition.

An external magnetic flux reacts in an input coil $M_i$ 14 of the signal SQUID 12. A DROS output at both ends of the reference SQUID 13 is detected by a pre-amplifier 19. A constant current source $I_b$ for operating the DROS is controlled by an operation application current source current controller 17 at normal temperature. A feedback coil $M_f$ 15 constitutes a flux-locked loop (FLL) and is used to measure an external magnetic flux. A RS-DROS 11 is located at 4.2 K. The two current controllers (the operation application current source current controller 17 and the reference voltage application current source current controller 18) and the pre-amplifier 19 operates at normal temperature.

Meanwhile, as shown in FIG. 2, the reference junction-type DROS (RJ-DROS) 21 having a signal SQUID 22 and a reference junction 23 has the reference junction, instead of the reference SQUID, and a fixed reference current. The RJ-DROS 21 has a simple structure and is easy to operate.

A current $I_b$ for operating the RJ-DROS is controlled by an operation application current source current controller 26 at normal temperature. An external magnetic flux reacts through an input coil 24 of the signal SQUID 22. An output of the RJ-DROS at both sides of the reference junction 23 is detected by a pre-amplifier 27. A feedback coil 25 is used to operate the DROS in FLL mode.

However, in the related art DROS, i.e., the reference SQUID type DROS 11 having the signal SQUID 12 and the reference SQUID 13, two SQUID must be formed at the same time and the magnetic flux coil 16 is required in order to control the reference current of the reference SQUID 13. Accordingly, the related art DROS is complicated in structure and is difficult to operate.

To solve the problems, the reference junction-type DROS 21 having the signal SQUID 22 and the reference junction 23 was developed in order to simplify the structure and manufacture. However, the reference junction-type DROS 21 is problematic in that characteristics of the DROS cannot be controlled because the reference current of the reference junction 23 is fixed.

SUMMARY OF THE INVENTION

Accordingly, the present invention has been made in view of the above problems occurring in the prior art, and it is an object of the present invention to provide a method of controlling the characteristics of a double relaxation oscillation SQUID having a reference junction, in which a reference current of the reference junction can be changed using current flowing through the reference junction in a reference junction-type DROS (RJ-DROS) having a fixed reference current, whereby a magnetic flux-voltage characteristic and a transfer coefficient of the DROW can be easily controlled from the outside and the operation of the DROS can be stabilized.

To achieve the above object, according to an embodiment of the present invention, there is provided a method of controlling the characteristics of a double relaxation oscillation SQUID having a reference junction, wherein a reference DC current flows through the reference junction in order to control the characteristics of the DROS.

At this time, at the reference junction, a modulation width of an averaged relaxation voltage, which reacts to a magnetic flux, may be controlled, an amount (modulation depth) of an averaged relaxation voltage, which reacts to a magnetic flux, may be controlled, an amount of an operation application current may be controlled, or a magnetic flux-voltage transfer coefficient may be controlled.

Furthermore, the difference between reference currents of the reference junction, which occurs when fabricating the DROS, may be made identical. Furthermore, a line connected in order to detect a voltage of the reference junction may be used to cause the DC current to flow through the reference junction. When a critical current of the reference junction, which is set when the DROS is fabricated, exceeds a critical current of the signal SQUID, the critical current may be returned to its operation range by causing a DC current to flow through the reference junction.

The method may further include a pre-amplifier connected to the reference junction. A reference current may be controlled using the DC current, and an input application current of the pre-amplifier connected to the reference junction may be eliminated not to flow through the reference junction.

When an input application current of a pre-amplifier connected to the reference junction in order to detect an output of the DROS influences the reference junction to change characteristics of the reference junction or a saturation state is made using a gap voltage, the input application current may be offset and the reference current may be controlled by causing a DC current of a reference junction application current controller to flow through the reference junction.

BRIEF DESCRIPTION OF THE DRAWINGS

Further objects and advantages of the invention can be more fully understood from the following detailed description taken in conjunction with the accompanying drawings in which.

DESCRIPTION ON REFERENCE NUMERALS

Figure 1:
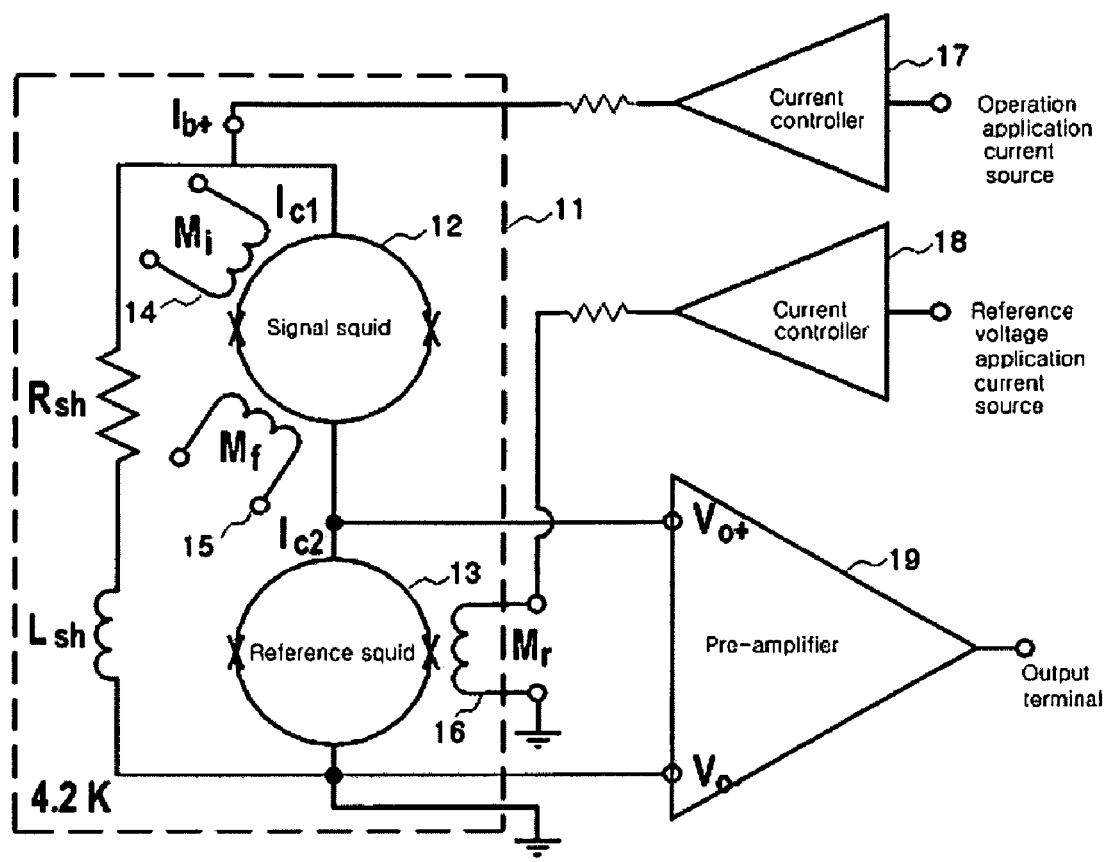
FIG. 1 is an equivalent circuit diagram of a DROS having a reference SQUID (RS-DROS) in the related art.
Figure 2:
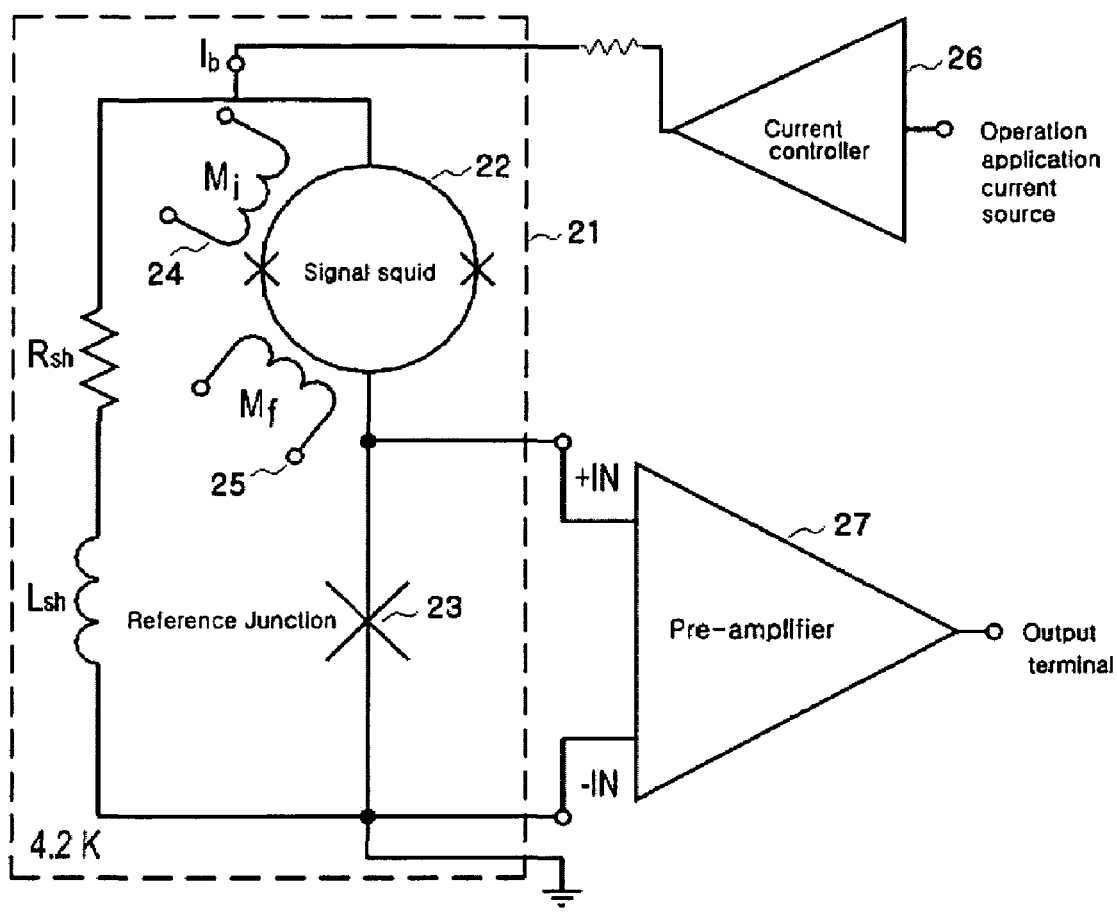
FIG. 2 is an equivalent circuit diagram of a DROS having a reference junction (RJ-DROS) in the related art.

31: RJ-DROS
32: signal SQUID
33: reference junction
34: magnetic flux input coil of signal SQUID
35: feedback coil of signal SQUID
36: DROS operation application current source current controller
37: reference junction application current controller
38: pre-amplifier
41: critical current of signal SQUID
42: fixed reference current of reference junction
43: reference current when reference junction current $I_a$ is applied
44: RJ-DROS output voltage of reference current $I_{c2}$
45: RS-DROS output voltage when reference current $(I_{c2}-I_a)$
46: RJ-DROS output voltage when reference junction current $I_a$
51: critical current of reference junction
52: reference current when reference junction current $I_a$ is applied
53: DROS operation application current
54: RJ-DROS output voltage of reference current $I_{c2}$
55: RJ-DROS output voltage when reference junction current $I_a$ is applied

DETAILED DESCRIPTION OF THE PREFERRED EMBODIMENT

The present invention will now be described in detail in connection with a specific embodiment with reference to the accompanying drawings.

Figure 3:
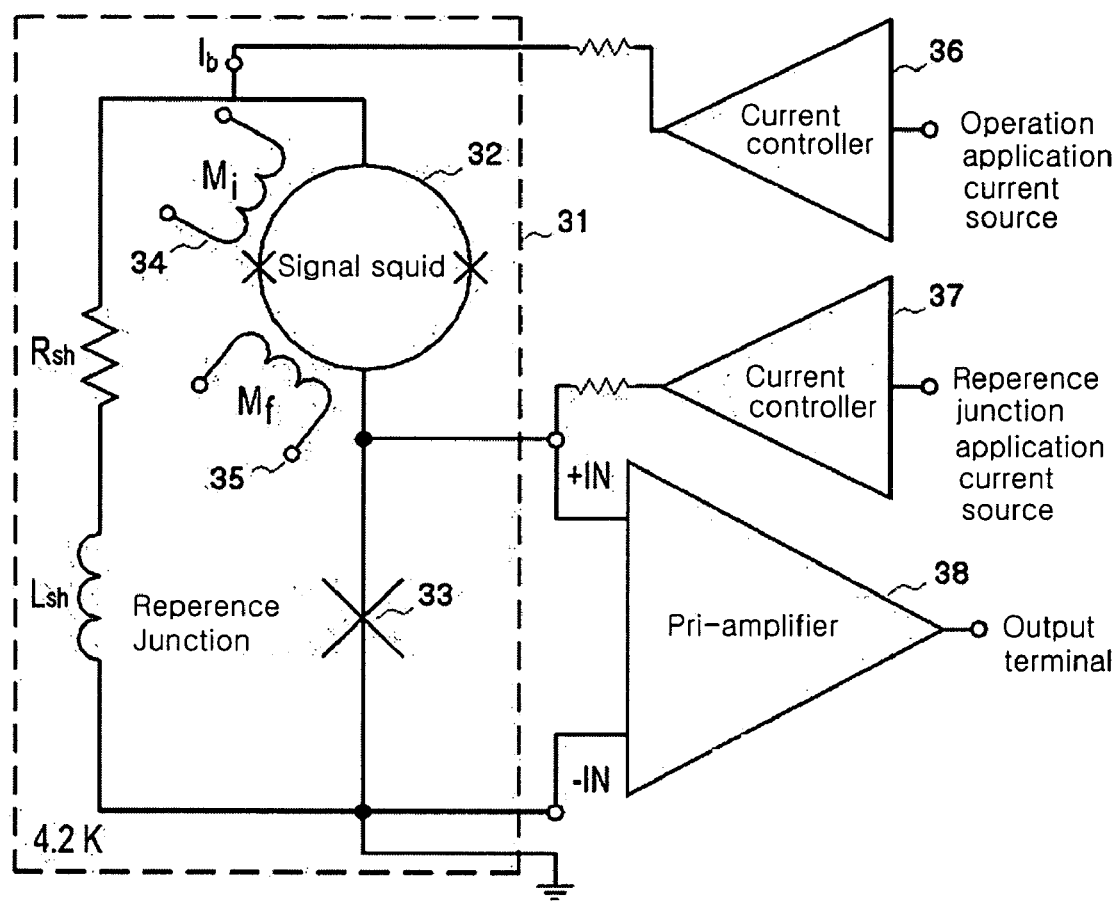
FIG. 3 is a circuit diagram for controlling characteristic of a DROS having a reference junction (RJ-DROS) according to an embodiment of the present invention.
Figure 4:
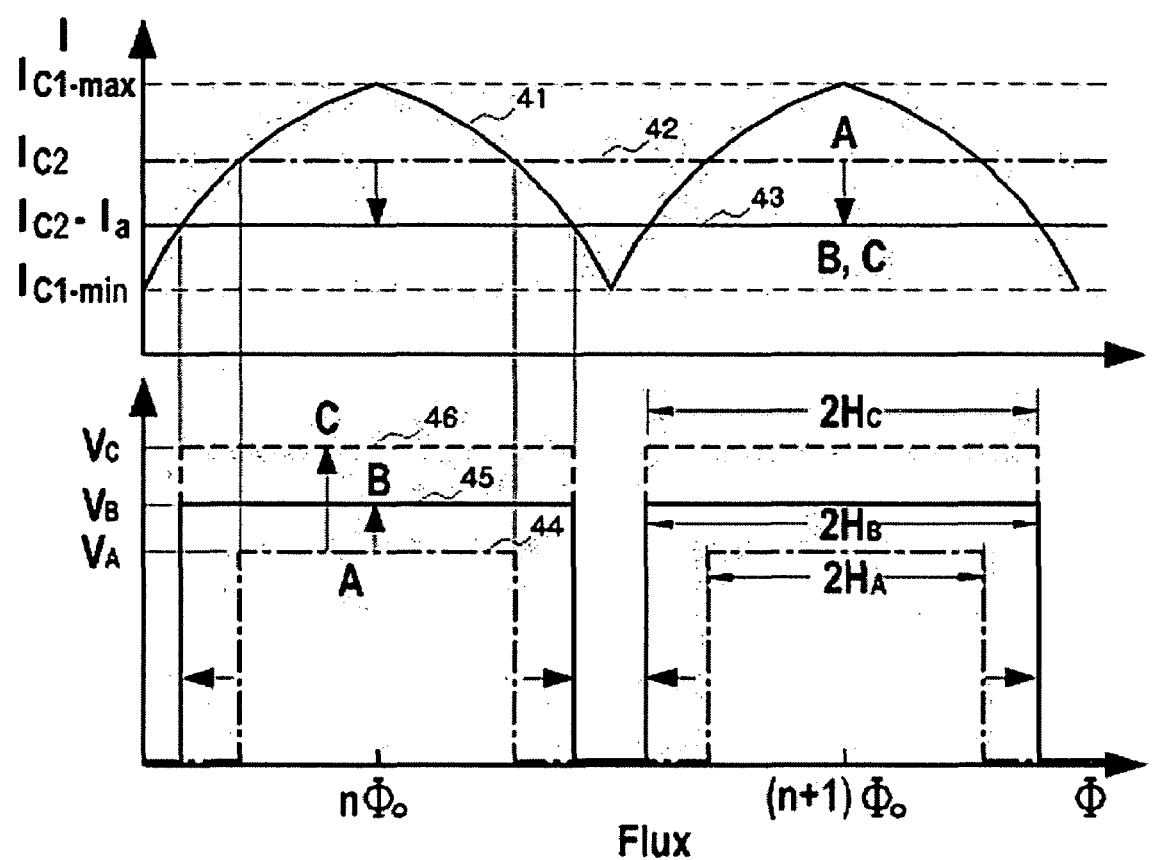
FIG. 4 is a graph showing the relationship between a magnetic flux and a critical current of the signal SQUID and the relationship between a magnetic flux and a voltage characteristic of the RJ-DROS according to an embodiment of the present invention.
Figure 5:
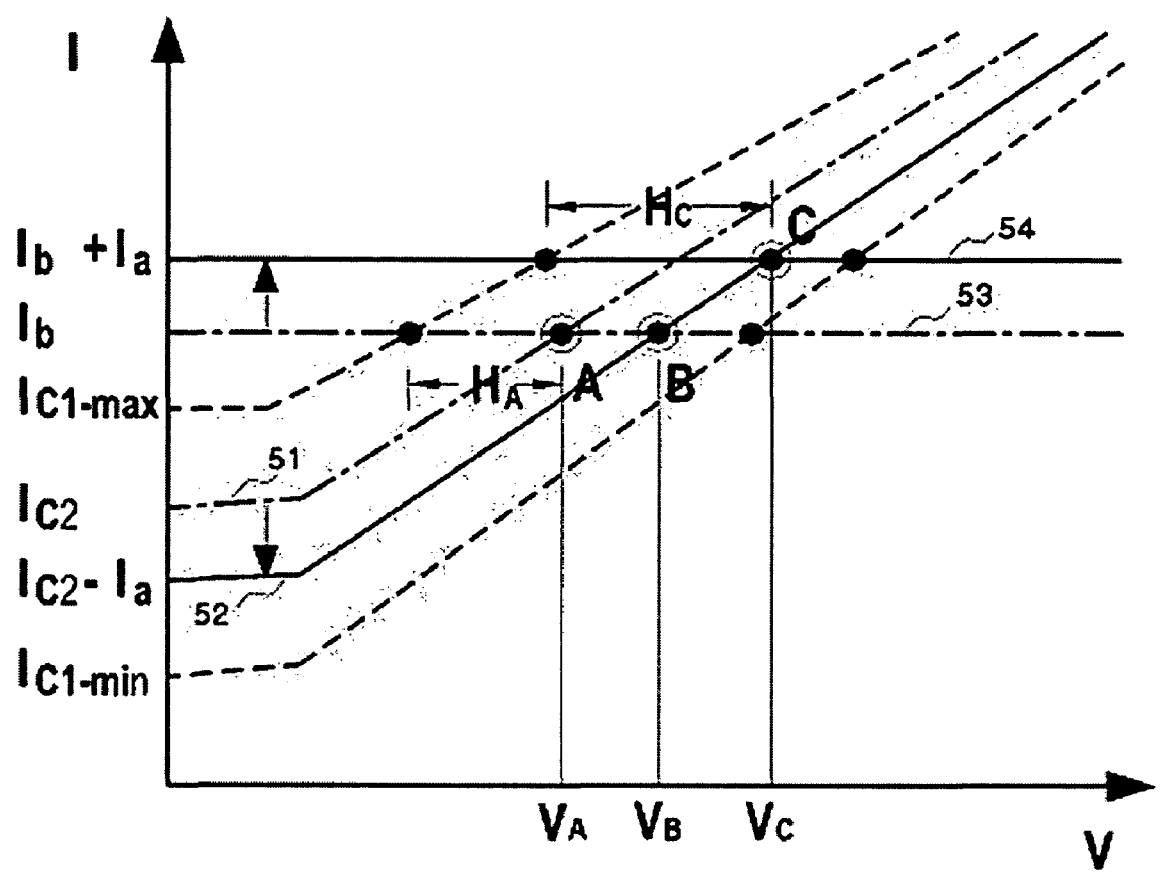
FIG. 5 is a graph showing a current-voltage characteristic of the RJ-DROS according to an embodiment of the present invention.

FIG. 3 is a circuit diagram for controlling characteristic of a DROS having a reference junction (RJ-DROS) according to an embodiment of the present invention. FIG. 4 is a graph showing the relationship between a magnetic flux and a critical current of the signal SQUID and the relationship between a magnetic flux and a voltage characteristic of the RJ-DROS according to an embodiment of the present invention. FIG. 5 is a graph showing a current-voltage characteristic of the RJ-DROS according to an embodiment of the present invention.

As shown in FIG. 3, The RJ-DROS of the present invention includes a reference junction application current controller 37 that outputs current to a reference junction-type DROS (RJ-DROS) 31 and a reference junction 33. The RJ-DROS operates within 4.2K helium (He) Dewar. Current controllers (an operation application current source current controller 36 and a reference junction application current controller 37), and a pre-amplifier 38 operate at normal temperature.

If an external magnetic flux is input to a signal SQUID 32 through an input coil 34 $M_i$, a critical current $I_{c1}$ of the signal SQUID 32 appears like reference numeral "41" (refer to FIG. 4) between the highest critical current $I_{c1-max}$ and the lowest critical current $I_{c1-min}$ according to the external magnetic flux. A critical current $I_{c2}$ of the reference junction 33 is fabricated to have the relationship "$I_{c1-min}<I_{c2}<I_{c1-max}$". At this time, a reference current of the reference junction 33 has fixed $I_{c2}$.

As $I_{c2}$ approaches $I_{c1-min}$, an averaged relaxation voltage of the reference junction 33 that reacts to the magnetic flux is increased. However, when the highest critical current of the signal SQUID 32 is $I_{c1-max}$, the critical current $I_{c2}$ of the reference junction 33 is fabricated to be fixed to "$I_{c2}=0.7\sim0.8I_{c1-max}$" at the RJ-DROS.

To change the reference current $I_{c2}$ of the fixed reference junction 33, the reference junction application current controller 37 is connected to the reference junction 33. If the current $I_a$ flows through the reference junction application current controller 37, the reference current at the reference junction 33 has $(I_{c2}-I_a)$.

The results of comparing the reference current $(I_{c2}-I_a)$ with the critical current of the signal SQUID 32 according to the magnetic flux variation is shown at an upper graph of FIG. 4. The fixed reference current $I_{c2}$ 42 is changed into the $(I_{c2}-I_a)$ 43 by means of the added current $I_a$. At this time, a magnetic flux-voltage characteristic occurring in the reference junction 33 is shows at a lower graph of FIG. 4.

Assuming that according to the critical current $I_{c1}$ 41 of the signal SQUID 32 depending on variation in the magnetic flux, an averaged relaxation voltage of the reference junction 33 depending on variation in an external magnetic flux is $V_A$ 44 when the reference current is $I_{c2}$ and an averaged relaxation voltage of the reference junction is $V_C$ 46 when the reference current is $(I_{c2}-I_a)$, a magnetic flux-voltage modulation width increases from 2 $H_A$ to 2 $H_C$ as the current $I_a$ increases, as shown at the lower graph of FIG. 4.

In this case, in the case of the reference SQUID type DROS (RS-DROS), the averaged relaxation voltage is $V_B$ as the reference current $(I_{c2}-I_a)$ increases. Meanwhile, if the reference current falls to $(I_{c2}-I_a)$, a difference between the reference current and the operation application current $I_b$ of the DROS increases and the averaged relaxation voltage $V_{dc}$ also increases.

FIG. 5 shows a characteristic of the application current $I_b$ and the averaged relaxation voltage $V_{dc}$ of reference junction or the reference SQUID against variation in the critical current of the signal SQUID. From FIG. 5, it can be seen that if the reference current is changed from $I_{c2}$ 51 to $(I_{c2}-I_a)$ 52 in the RS-DROS, the output voltage $V_{dc}$ is changed from $V_A$ of a point A to $V_B$ of a point B.

Meanwhile, if the current $I_a$ flows through the reference junction having the critical current $I_{c2}$ in the RJ-DROS, the reference current changes from the $I_{c2}$ 51 to the $(I_{c2}-I_a)$ 52 and an output becomes $V_C$ of the point C at $V_A$ of the point A. The increase of the current $I_a$ in the reference junction causes an original DROS operation application current $I_b$ 53 to increase to $(I_b+I_a)$ 54 and to have $V_C$ higher than the output $V_B$ of the RS-DROS.

Therefore, the method of making the current flow through the reference junction has the same effect as the method of changing the reference current by changing the magnetic flux of the reference SQUID in the related art RS-DROS 11. It is therefore to control an averaged relaxation voltage and a modulation width in the magnetic flux-voltage characteristic.

More particularly, the averaged relaxation voltage $V_{dc}$ is higher than the reference SQUID averaged relaxation voltage of the RS-DROS in the reference junction of the RJ-DROS due to the increase in the DROS operation application current.

If the critical current $I_{c2}$ of the reference junction is set to "$I_{c2} \leq I_{c1-min}$, $I_{c2} \geq I_{c1-max}$", which exceeds the critical current range of the signal SQUID, the DROS does not respond to an external magnetic flux. The range of $I_{c1-min} < I_{c2} < I_{c1-max}$ can be controlled by allowing the current to flow through the reference junction so that the DROS operates stably.

Meanwhile, when the output of the reference junction is detected using the pre-amplifier 38, if an input application current of the pre-amplifier 38 flows through the reference junction 33 to change characteristics of the RJ-DROS, or flows greater than the critical current of the reference junction 33 and the RJ-DROS does not operate, the additional current $I_a$ is caused to flow through the reference junction 33 so that an input application current of the pre-amplifier 38 does not flow through the reference junction 33. Accordingly, the RJ-DROS can operate normally.

At this time, a connection line along which the current flows through the reference junction 33 may be the same as that used to detect an output voltage in the reference junction 33. An additional connection line is not needed to the RJ-DROS operating at 4.2K.

Alternatively, in the RJ-DROS, the current may be made flow through the reference junction having the fixed critical current in order to control the reference current and the DROS may have an optimal magnetic flux-voltage characteristic in order to obtain a stabilized output.

Meanwhile, in the reference junction-type DROS, the critical current of the reference junction must be set in the range of the critical current of the signal SQUID. However, when the critical current of the reference junction has a predetermined value or a reference current, the current is caused to flow through the reference junction in order to return the critical current to a normal critical current range. Accordingly, the DROS can operate stably.

To detect the output of the reference junction-type DROS, the pre-amplifier having a number of junction bipolar transistors is connected to the reference junction. If an input application current of the pre-amplifier is higher than the critical current of the reference junction, a voltage saturation state occurs in the reference junction, which hinders the DROS from normally operating. At this time, some of the current output to the reference junction may be used in order to offset the input application current of the pre-amplifier. Accordingly, the DROS can operate stably.

As described above, in accordance with the method of controlling the characteristics of the double relaxation oscillation SQUID having the reference junction according to the present invention, the reference SQUID type DROS (RS-DROS) is complicated since it includes the signal SQUID and the reference SQUID. Furthermore, to control the magnetic flux-voltage characteristic, the current flows from the outside to the magnetic flux coil of the reference SQUID in order to control the reference current. Accordingly, the DROS requires an additional line for controlling the reference current.

To solve the disadvantages of the RS-DROS having the complicated structure, the DROS having the reference junction (RJ-DROS) was developed. However, the reference current of the reference junction is fixed when the RJ-DROS is fabricated and the magnetic flux-voltage characteristic of the DROS cannot be changed accordingly.

In accordance with the present invention, however, if the current flows through the reference junction in the RJ-DROS, the fixed reference junction current can be changed and an optimal DROS characteristic can be obtained by controlling the current externally.

Furthermore, though the RJ-DROS of the present invention has a simple structure, it can have a variable current connected thereto and has the same DROS characteristic control function as that of the RS-DROS. Furthermore, the RJ-DROS of the present invention has the function of increasing the operation application current. Accordingly, there is an advantage in that an averaged relaxation voltage is higher than that of the RS-DROS in the magnetic flux-voltage characteristic of the DROS.

Furthermore, a critical current range of the signal SQUID can be controlled using the reference junction current. Accordingly, there is an advantage in that the DROS can operate normally.

In addition, when detecting an output of the reference junction using the pre-amplifier including the plurality of junction bipolar transistors, some of the reference junction current is used to offset an input application current of the pre-amplifier. Accordingly, there is an advantage in that the DROS can operate stably without an influence on the input application current.

Furthermore, there is an advantage in that an electric wire for detecting the reference junction voltage can be used to an electric wire for applying the current to the reference junction without a line added in the related art reference junction-type DROS.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method of controlling the characteristics of a reference junction-type double relaxation oscillation superconducting quantum interference device (SQUID) (RJ-DROS) comprising a signal SQUID and a reference junction, wherein an additional reference DC current flows through the reference junction in order to control the characteristics of the DROS.

2. The method as claimed in claim 1, wherein a modulation width and depth of an averaged relaxation voltage at the reference junction is controlled by the additional reference DC current, in which the averaged relaxation voltage is a voltage which is induced to the reference junction according to variation of an external magnetic flux.

3. The method as claimed in claim 1, wherein a magnetic flux-voltage transfer coefficient is controlled by the additional reference DC current, in which the magnetic flux-voltage transfer coefficient represents a variation rate of a voltage which is induced to the reference junction according to variation of an external magnetic flux.

4. The method as claimed in claim 1, wherein a line connected in order to detect a voltage of the reference junction is used to cause the DC current to flow through the reference junction.

5. The method as claimed in claim 1, wherein when a critical current of the reference junction, which is set when the DROS is fabricated, exceeds a critical current of the signal SQUID, the critical current is returned to its operation range by causing the additional reference DC current to flow through the reference junction.

6. The method as claimed in claim 1, wherein the RJ-DROS further comprises a pre-amplifier which is connected to the reference junction and used in order to detect an output of the reference junction, and the additional reference DC current makes an input current of the pre-amplifier not to flow into the reference junction.

* * * * *